United States Patent
You (10) Patent No.: US 7,507,645 B2
(45) Date of Patent: Mar. 24, 2009

(54) METHOD OF FORMING POLYCRYSTALLINE SEMICONDUCTOR LAYER AND THIN FILM TRANSISTOR USING THE SAME

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 105 days.

(21) Appl. No.: 10/865,930

(22) Filed: Jun. 14, 2004

(65) Prior Publication Data

US 2005/0059222 A1 Mar. 17, 2005

(30) Foreign Application Priority Data

Sep. 17, 2003 (KR) .................. 10-2003-0064455

(51) Int. Cl.
*H01L 21/76* (2006.01)
(52) U.S. Cl. .................. 438/487; 257/E21.134; 438/486
(58) Field of Classification Search .......... 438/486, 438/487; 257/E21.134
See application file for complete search history.

(56) References Cited

U.S. PATENT DOCUMENTS

| 5,683,935 | A  | * | 11/1997 | Miyamoto et al. | ............. | 117/8 |
| 5,821,135 | A  | * | 10/1998 | Mei et al. | ..................... | 438/57 |
| 6,635,555 | B2 | * | 10/2003 | Voutsas | ..................... | 438/487 |
| 6,635,932 | B2 | * | 10/2003 | Grigoropoulos et al. | .... | 257/359 |
| 6,656,270 | B2 | * | 12/2003 | Chung | ........................ | 117/89 |

\* cited by examiner

*Primary Examiner*—Asok K Sarkar
(74) *Attorney, Agent, or Firm*—McKenna Long & Aldridge LLP (57) ABSTRACT

A method of forming a polycrystalline semiconductor layer includes forming a semiconductor layer of amorphous silicon on a substrate, forming a plurality of spot seeds in the semiconductor layer by irradiating a first laser beam through a crystallization mask, each of the plurality of spot seeds being equally spaced from one another and each having equal area, and forming a polycrystalline silicon layer along an entire surface of the substrate by irradiating a second laser beam onto the semiconductor layer.

7 Claims, 12 Drawing Sheets

METHOD OF FORMING POLYCRYSTALLINE SEMICONDUCTOR LAYER AND THIN FILM TRANSISTOR USING THE SAME

The present invention claims the benefit of Korean Patent Application No. 2003-0064455, filed in Korea on Sep. 17, 2003, which is hereby incorporated by reference.

BACKGROUND OF THE INVENTION

1. Field of the Invention

The present invention relates to a method of forming a semiconductor layer, and more particularly, to a method of crystallizing amorphous silicon for a flat panel display device and a thin film transistor fabricated using a method of crystallizing amorphous silicon.

2. Discussion of the Related Art

Presently, flat panel display (FPD) devices are being developed having high portability and low power consumption. Among various types of FPD devices, liquid crystal display (LCD) devices are commonly used as monitors for notebook and desktop computers because of their ability to display high resolution images, wide ranges of different colors, and moving images.

In general, an LCD device includes a color filter substrate and an array substrate separated from each other by a liquid crystal layer, wherein the color filter substrate and the array substrate include a common electrode and a pixel electrode, respectively. When a voltage is supplied to the common electrode and the pixel electrode, an electric field is generated that affects orientation of liquid crystal molecules of the liquid crystal layer due to optical anisotropy within the liquid crystal layer. Consequently, light transmittance characteristics of the liquid crystal layer become modulated and images are displayed by the LCD device.

The array substrate includes thin film transistors (TFTs) that function as switching elements. Since amorphous silicon may be formed on low-cost glass substrates at low temperatures, amorphous silicon is commonly used for active layers in the TFTs of an LCD device. In addition, since a driving circuit is required to drive the amorphous TFT (a-TFT), the driving circuit includes a plurality of complementary metal-oxide-semiconductor (CMOS) elements having single crystalline silicon layers. Large-scale integration (LSI) circuits using single crystalline silicon layers are commonly connected to array substrates using amorphous silicon layers via connection systems, such as tape automated bonding (TAB). However, since the costs of fabricating the driving circuits are relatively high, costs of LCD devices using the driving circuits is also relatively high.

Currently, LCD devices are being developed to include TFTs using polycrystalline silicon as the active layer (poly-TFTs). Accordingly, driving circuits of the LCD devices incorporating poly-TFTs can be formed on the same substrate as the TFTs formed within pixel regions. Thus, additional processes for connecting the TFTs of the pixel regions with the driving circuits may be eliminated, thereby material costs for the driving circuits are reduced and the process of fabricating the LCD devices is simplified. In addition, since polycrystalline silicon has a field effect mobility greater than a field effect mobility of amorphous silicon, the LCD device incorporating the poly-TFTs has a faster response time and increased resistance to adverse effects due to heat and light.

Polycrystalline silicon may be deposited directly, or may be formed by crystallizing amorphous silicon deposited through a plasma enhanced chemical vapor deposition (PECVD) method or by a low pressure chemical vapor deposition (LPCVD) method. Methods of crystallizing amorphous silicon may be classified into a solid phase crystallization (SPC) method, a metal induced crystallization (MIC) method, an excimer laser annealing (ELA) method, and a sequential lateral solidification (SLS) method. Among these various different methods of crystallizing amorphous silicon, an ELA method using ultraviolet (UV) light produced by an excimer laser is commonly used. In the ELA method, since a layer of amorphous silicon is annealed for a short time period, a substrate is not deteriorated even under a melting temperature of silicon. Accordingly, a polycrystalline silicon layer of excellent crystallinity is obtained by annealing an amorphous silicon layer with an excimer laser.

Figure 1:
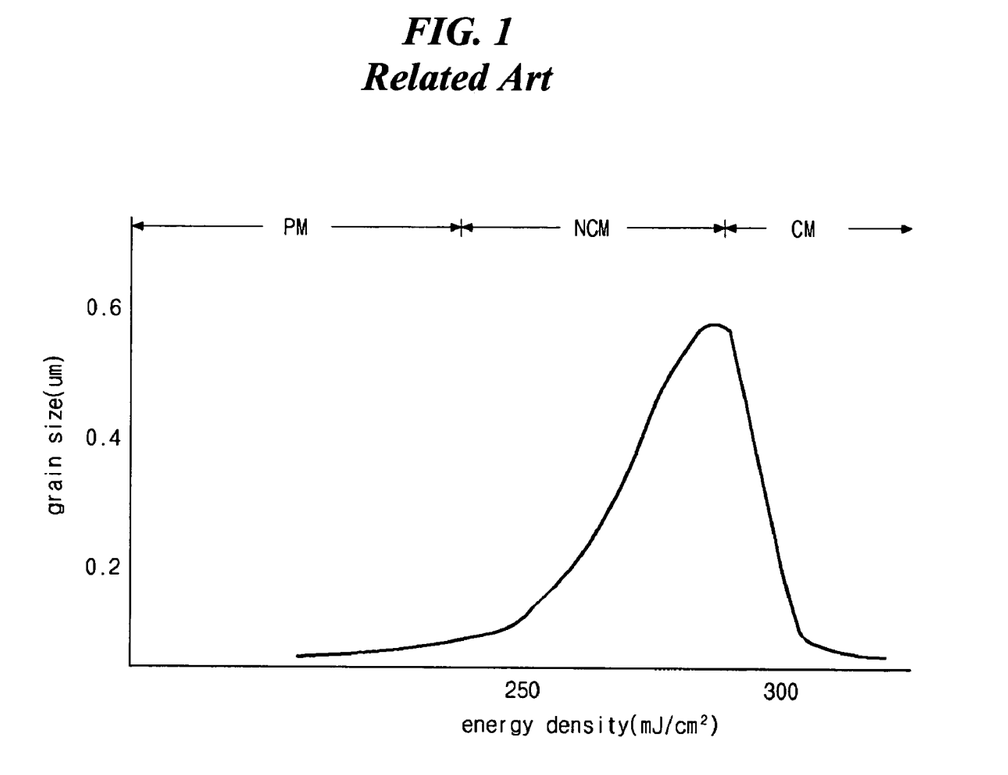
FIG. 1 is a graph showing a relationship between grain size and laser energy density from an excimer laser annealing method according to the related art.

An ELA method includes melting a layer of amorphous silicon and instantaneous solidification when a laser beam of an excimer laser is irradiated onto the melted amorphous silicon. FIG. 1 is a graph showing a relationship between grain size and laser energy density from an excimer laser annealing method according to the related art. As shown in FIG. 1, an amorphous silicon layer having a thickness of about 500 Å shows that melting depth and crystallinity are determined by the energy density of the laser beam.

In FIG. 1, as an energy density of a laser beam increases, a melting depth from a top surface to an interface between liquid and solid states of the amorphous silicon increases and an amount of melted silicon also increases, wherein the amorphous silicon layer completely melts over a critical energy density "$E_C$." The melting amorphous silicon layer is re-crystallized and converted into a polycrystalline silicon layer. Accordingly, crystallinity of the polycrystalline silicon layer depends on a state of melting the amorphous silicon layer.

A range of an energy density of the laser beam irradiated onto the amorphous silicon layer may be classified into three different regimes according to a state of melting the amorphous silicon layer: a partial melting (PM) regime; a nearly complete melting (NCM) regime; and a complete melting (CM) regime. In the PM regime, only an upper portion of the amorphous silicon layer melts. Accordingly, while the melting upper portion is re-crystallized, a grain vertically grows using the lower portion of the amorphous silicon layer as a seed. As a result, although grain size variation according to an energy density is small, grain size is also small within the PM regime. In the NCM regime, most of the amorphous silicon layer melts, to an interface of the amorphous silicon and the substrate, and a polycrystalline silicon layer is produced having a grain size of about 1000 Å to about 6000 Å. Specifically, as the energy density approaches the critical energy density "$E_C$," grain size sharply increases. In the CM regime, all of the amorphous silicon layer melts and grain size is small due to homogeneous nucleation. Since a grain size of the polycrystalline silicon layer is largest within the NCM regime, energy density in the NCM regime is selected to crystallize the amorphous silicon layer.

Figure 2A:
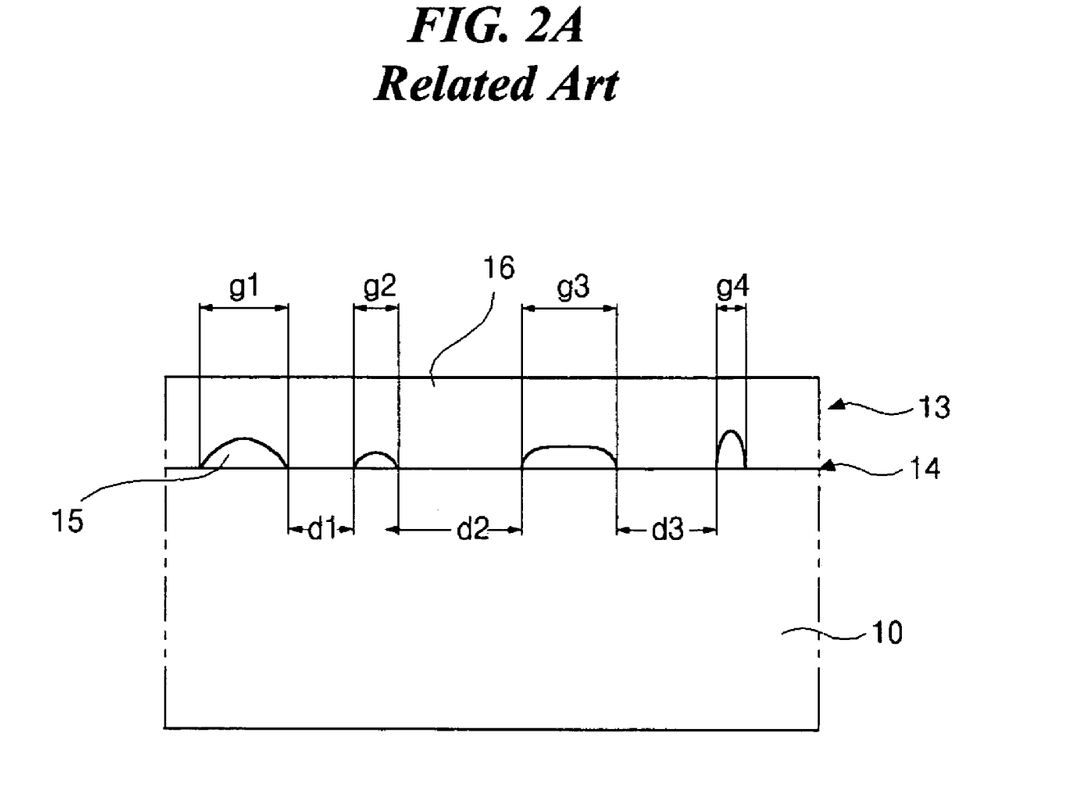
FIGS. 2A to 2C are schematic cross sectional views of an amorphous silicon crystallization process according to the related art.

FIGS. 2A to 2C are schematic cross sectional views of an amorphous silicon crystallization process according to the related art. In FIG. 2A, most of a semiconductor layer 13 of amorphous silicon melts to an interface 14 between the semiconductor layer 13 and a substrate 10 immediately after a laser beam is irradiated within a completely melting regime. For example, the semiconductor layer 13 may include a melting portion 16 and non-melting portions 15 of amorphous silicon having first, second, third, and fourth sizes g1, g2, g3, and g4, and the non-melting portions 15. may be separated by first, second, and third distances d1, d2, and to d3.

Figure 2B:
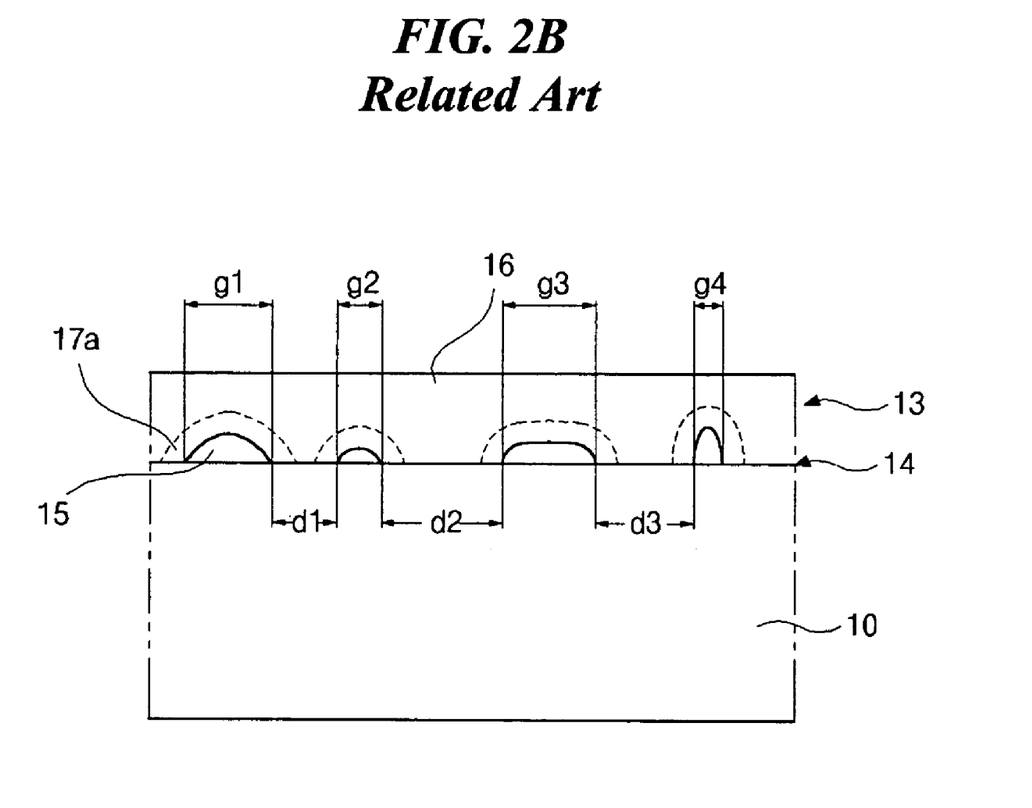

In FIG. 2B, grains 17a grow using the non-melting portions 15 as seeds while the melting portion 16 is solidified.

Figure 2C:
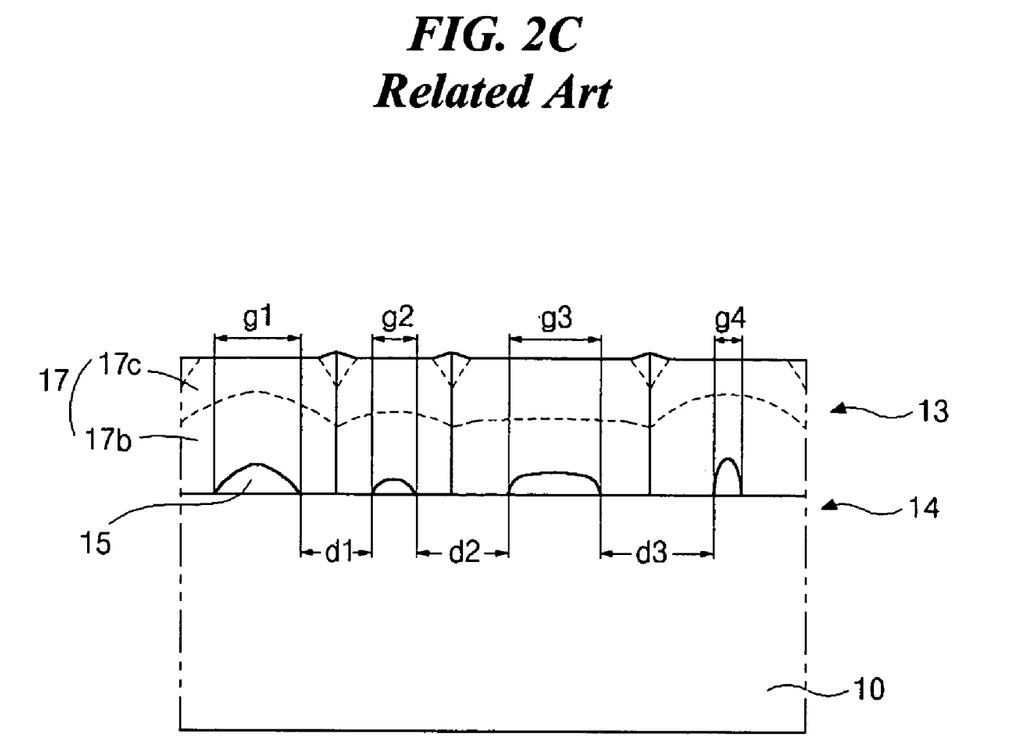

In FIG. 2C, the grains 17b and 17c continue growing, thereby solidifying the whole semiconductor layer 13 to have final grains 17 of polycrystalline silicon. Since the positions of the non-melting portions 15 are randomly disposed, the final grains are randomly disposed and are not controllable.

However, within the NCM regime, grain size variation is large due to an energy density of the laser beam. Moreover, when a laser beam corresponding to the CM regime is irradiated, grain size is abruptly reduced. Thus, since grain size greatly varies even with small changes of the energy density, the ELA process has a narrow process window for achieving optimum results, wherein the process window is a process error margin where deterioration does not occur. As the process window becomes narrower, production yield decreases and production costs increase.

An excimer laser using source gases, such as xenon chloride (XeCl), having a wavelength of 308 nm does not irradiate a laser beam having an exact energy density. For example, when an energy density of 260 mJ/cm$^2$ is set for the laser beam, the excimer laser cannot irradiate a laser beam having an exact energy density of 260 mJ/cm$^2$ due to an inherent error of the excimer laser apparatus. Accordingly, grain size and distances between the grains are not uniform in the layer of polycrystalline silicon. Consequently, as shown in FIGS. 2A-2C, since positions and grain sizes g1, g2, g3, and g4 of the non-melting portions 15 of amorphous silicon and distances d1, d2, and d3 between the non-melting portions 15 are not controllable due to the narrow process window, the final grain sizes of the polycrystalline layer 13 are not uniform. Thus, the non-uniformity of the grain sizes deteriorates operational characteristics of a TFT using the polycrystalline layer 13.

SUMMARY OF THE INVENTION

Accordingly, the present invention is directed to a method of forming a polycrystalline silicon layer and a thin film transistor using a polycrystalline silicon layer that substantially obviates one or more of the problems caused by limitations and disadvantages of the related art.

An object of the present invention is to provide a method of forming a polycrystalline silicon layer having uniform grain size and uniform distance between adjacent grains.

Another object of the present invention is to provide an excimer laser annealing method of an amorphous silicon layer having a wide process window.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a polycrystalline semiconductor layer includes forming a semiconductor layer of amorphous silicon on a substrate, forming a plurality of spot seeds in the semiconductor layer by irradiating a first laser beam through a crystallization mask, each of the plurality of spot seeds being equally spaced from one another and each having equal area, and forming a polycrystalline silicon layer along an entire surface of the substrate by irradiating a second laser beam onto the semiconductor layer.

In another aspect, a method of forming a polycrystalline semiconductor layer includes forming a semiconductor layer of amorphous silicon on a substrate, disposing a crystallization mask over the semiconductor layer, irradiating a first laser beam through the crystallization mask onto the semiconductor layer to form a plurality of spot seeds, each of the spot seeds being equally spaced apart from one another and having equal areas, and irradiating a second laser beam onto the semiconductor layer to form a polycrystalline semiconductor layer.

In another aspect, a thin film transistor device includes an active layer of polycrystalline silicon, the active layer including a plurality of equal-sized grains, a gate insulating layer on the active layer, a gate electrode on the gate insulating layer, an interlayer insulating layer on the gate electrode, and source and drain electrodes on the interlayer insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3A:
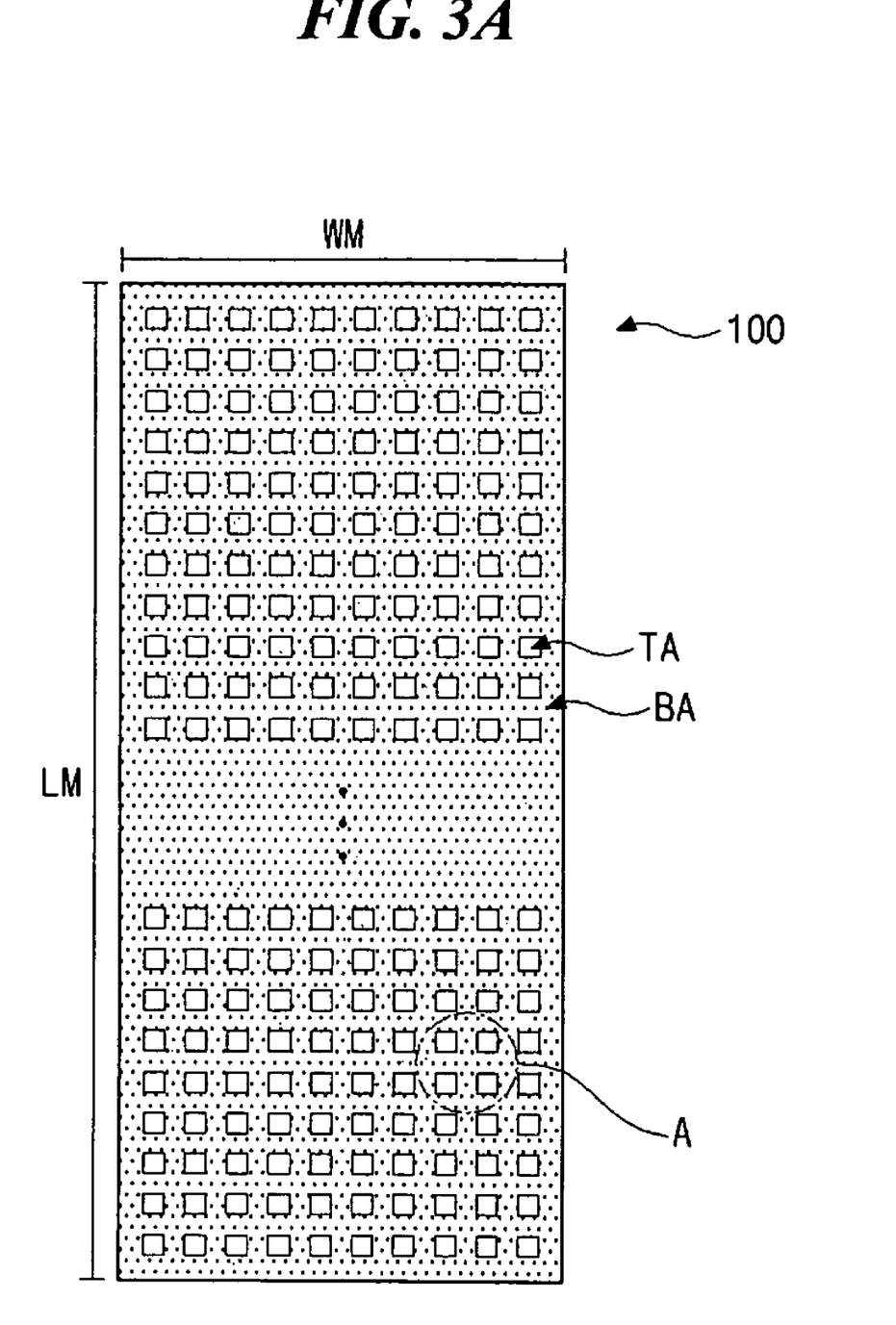
FIG. 3A is a schematic plan view of an exemplary crystallization mask according to the present invention.
Figure 3B:
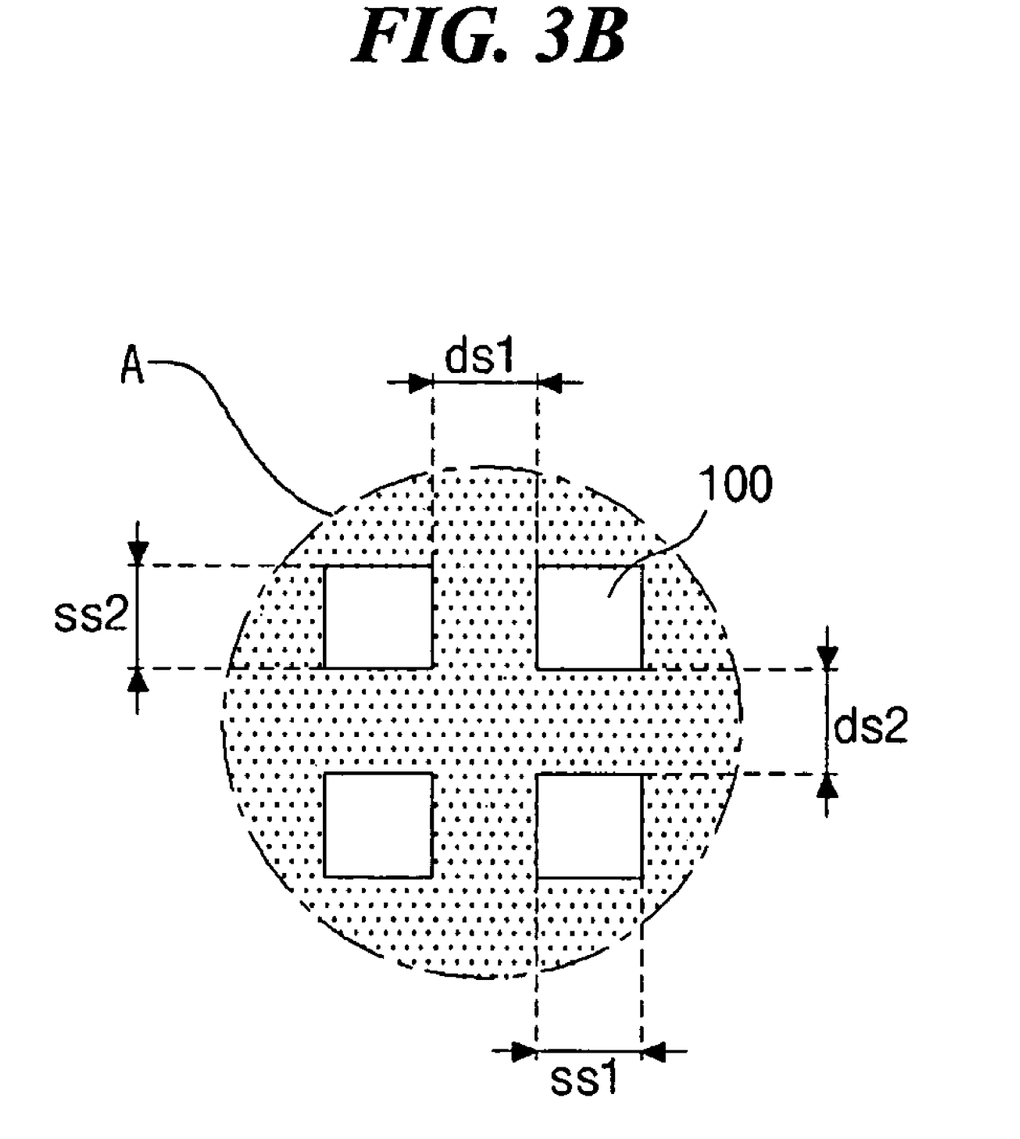
FIG. 3B is an enlarged view of a portion "A" of FIG. 3A according to the present invention.

FIG. 3A is a schematic plan view of an exemplary crystallization mask according to the present invention, and FIG. 3B is an enlarged view of a portion "A" of FIG. 3A according to the present invention. In FIGS. 3A and 3B, a crystallization mask 100 may have a rectangular shape, wherein a width WM and a length LM of the crystallization mask 100 may be determined by laser beam characteristics of an excimer laser apparatus. For example, the laser beam used in an excimer laser annealing (ELA) method may have a width of about 0.1 mm to about 0.3 mm and a length of about several tens of millimeters to about several hundreds of millimeters. Thus, the crystallization mask 100 may have a width greater than a width of the laser beam and a length greater than a length of the laser beam to shield the laser beam entirely.

In addition, the crystallization mask 100 may include a blocking area BA and a plurality of transmissive areas TA. As shown in FIG. 3B, the plurality of transmissive areas TA (in FIG. 3A) may be uniformly spaced apart from each other by first and second distances ds1 and ds2, and each transmissive area TA (in FIG. 3A) may have a uniform rectangular shape having first and second sides ss1 and ss2. For example, the first and second sides ss1 and ss2 of the transmissive area TA (in FIG. 3A) may be within a range of about 0.5 μm to about 2 μm, and the first and second distances ds1 and ds2 between adjacent transmissive areas TA (in FIG. 3A) may be within a range of about 0.5 μm to about 5 μm. During subsequent laser irradiation steps, the laser beam may be irradiated onto a semiconductor layer through the plurality of transmissive areas TA (in FIG. 3A) of the crystallization mask 100, and may correspond to a plurality of spot seeds for crystallization.

Figure 4A:
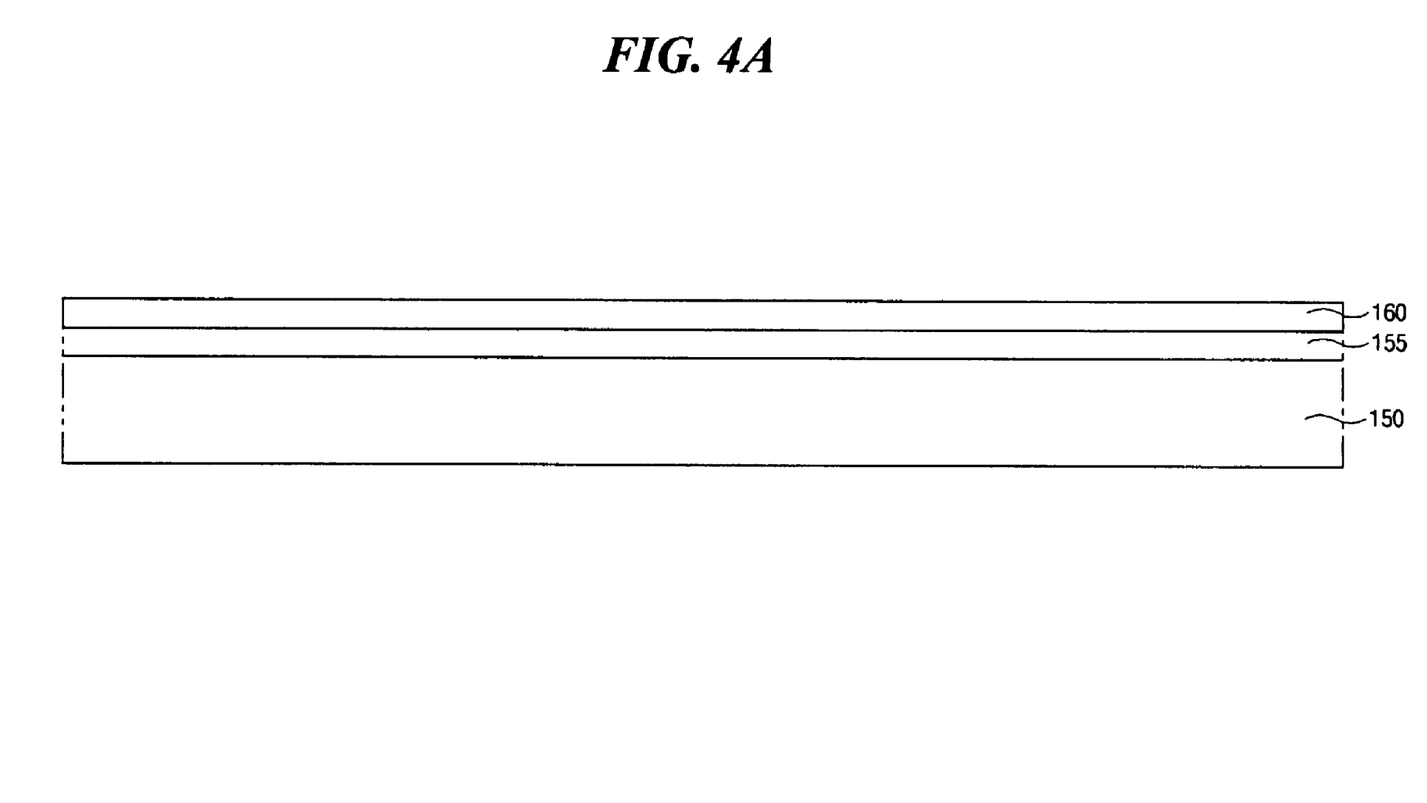
FIGS. 4A to 4C are schematic cross sectional views of an exemplary method for forming a polycrystalline silicon layer according to the present invention.

FIGS. 4A to 4C are schematic cross sectional views of an exemplary method for forming a polycrystalline silicon layer according to the present invention. In FIG. 4A, a buffer layer 155 may be formed on a substrate 150, and a semiconductor layer 160 of amorphous silicon may be formed on the buffer layer 155. For example, the buffer layer 155 may include silicon oxide ($SiO_2$). Accordingly, when the amorphous silicon layer 160 is crystallized and converted into a polycrystalline silicon layer 160, alkali ions, such as potassium ion (K+) and sodium ion (Na+), contained within the substrate 150 may transition (i.e., 1 each) into the polycrystalline silicon layer 160 and degrade operational characteristics of the polycrystalline silicon layer 160. Accordingly, the buffer layer 155 may be interposed between the substrate 150 and the semiconductor layer 160 of amorphous silicon.

Figure 4B:
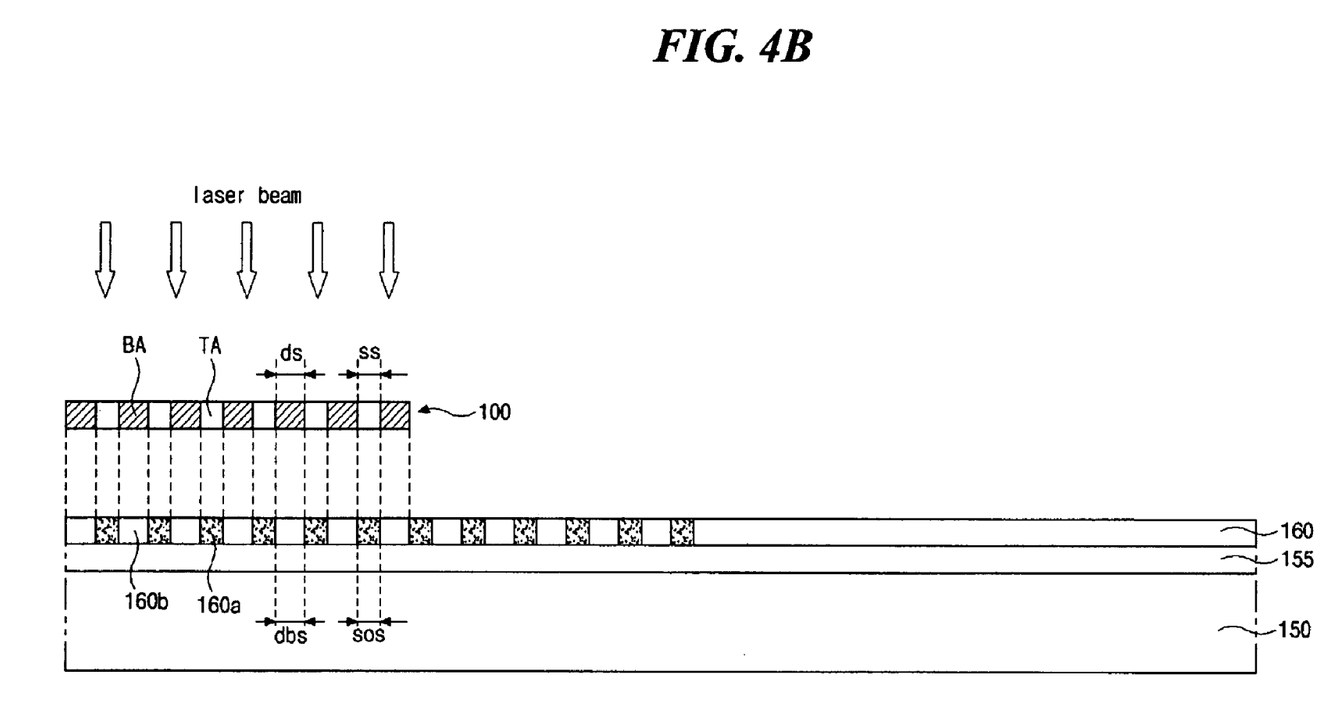

In FIG. 4B, a crystallization mask 100 having a blocking area BA and a plurality of transmissive areas TA may be disposed over the semiconductor layer 160 at a first position. Then, a laser beam may be irradiated onto the semiconductor layer 160 through the crystallization mask 100. The plurality of transmissive areas TA may be equally spaced by a distance ds, and each transmissive area TA may have a size ss. The laser beam may have an energy density corresponding to a complete melting (CM) regime, and may be irradiated onto the semiconductor layer 160 through the plurality of transmissive areas TA to form a plurality of spot seeds 160a corresponding to the plurality of transmissive areas TA. Since the laser beam has an energy density corresponding to the CM regime, the irradiated semiconductor layer completely melts, and then is solidified to become polycrystalline silicon. For example, when the semiconductor layer 160 has a thickness of about 500 Å, a laser beam having an energy density higher than about 295 mJ/cm² may completely melt the semiconductor layer 160. Since a portion 160b of the semiconductor layer 160 corresponding to the blocking area BA is not exposed to the laser beam, the portion 160b is not crystallized and remains as amorphous silicon. As a result, the semiconductor layer 160 includes the plurality of spot seeds 160a of polycrystalline silicon and the portion 160b of amorphous silicon surrounding the plurality of spot seeds 160a. The plurality of spot seeds 160a may be equally spaced by a distance dbs corresponding to the distance ds of the plurality of transmissive areas TA, and each spot seed 160a may have a size sos corresponding to the size ss of each transmissive area TA.

Figure 4C:
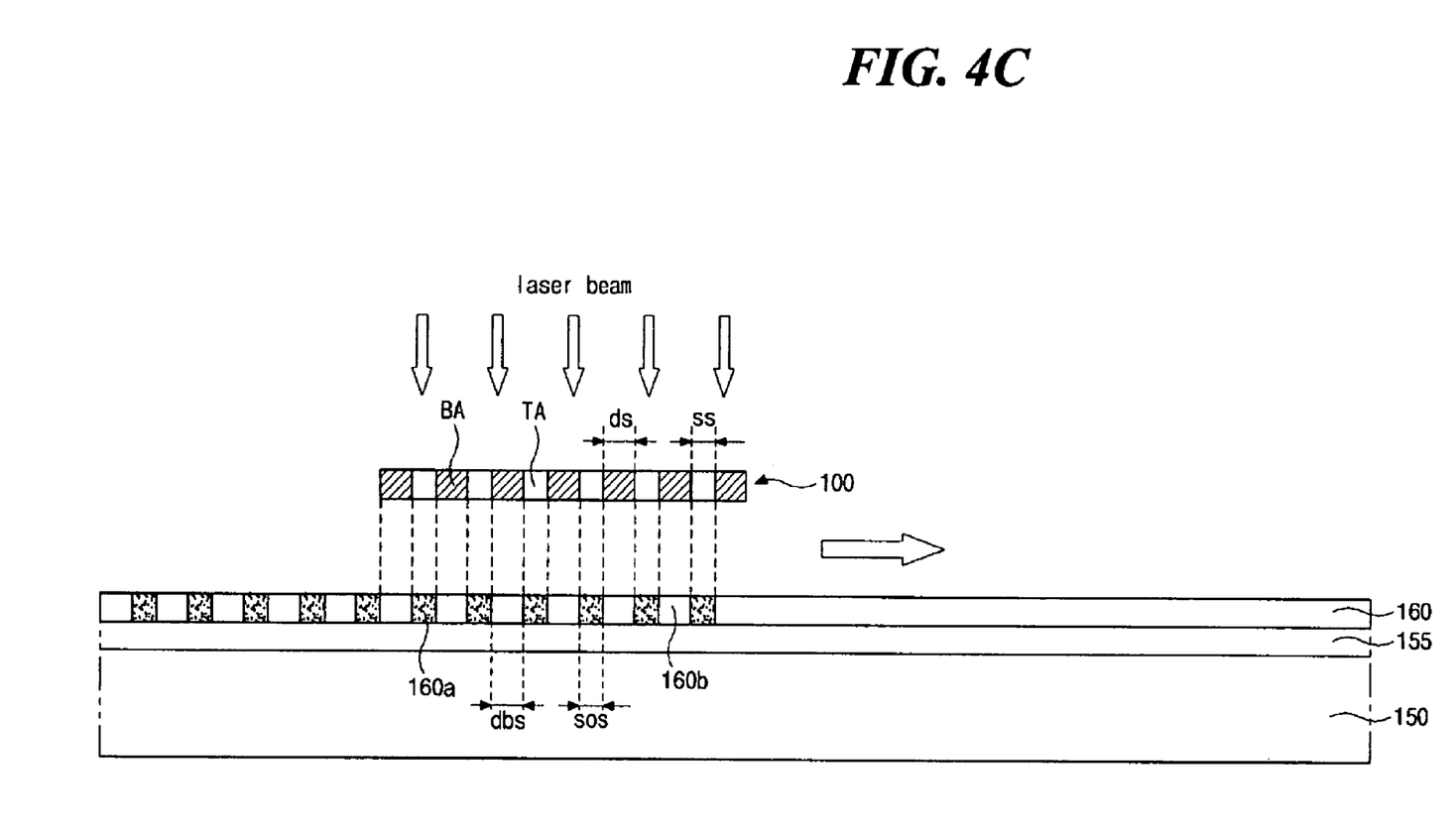

In FIG. 4C, the crystallization mask 100 is disposed at a second position spaced apart from the first position by a predetermined distance. Then, the laser beam is irradiated onto the semiconductor layer 160. The predetermined distance may correspond to a width WM (in FIG. 3) of the crystallization mask 100. For example, the crystallization mask 100 at the second position may overlap the crystallization mask 100 at the first position such that the plurality of spot seeds 160a may be equally spaced apart. The plurality of spot seeds 160a of polycrystalline silicon having a uniform size sos and a uniform distance dbs may be formed in the whole semiconductor layer 160 by repeating the steps shown in FIGS. 4B and 4C.

Figure 5:
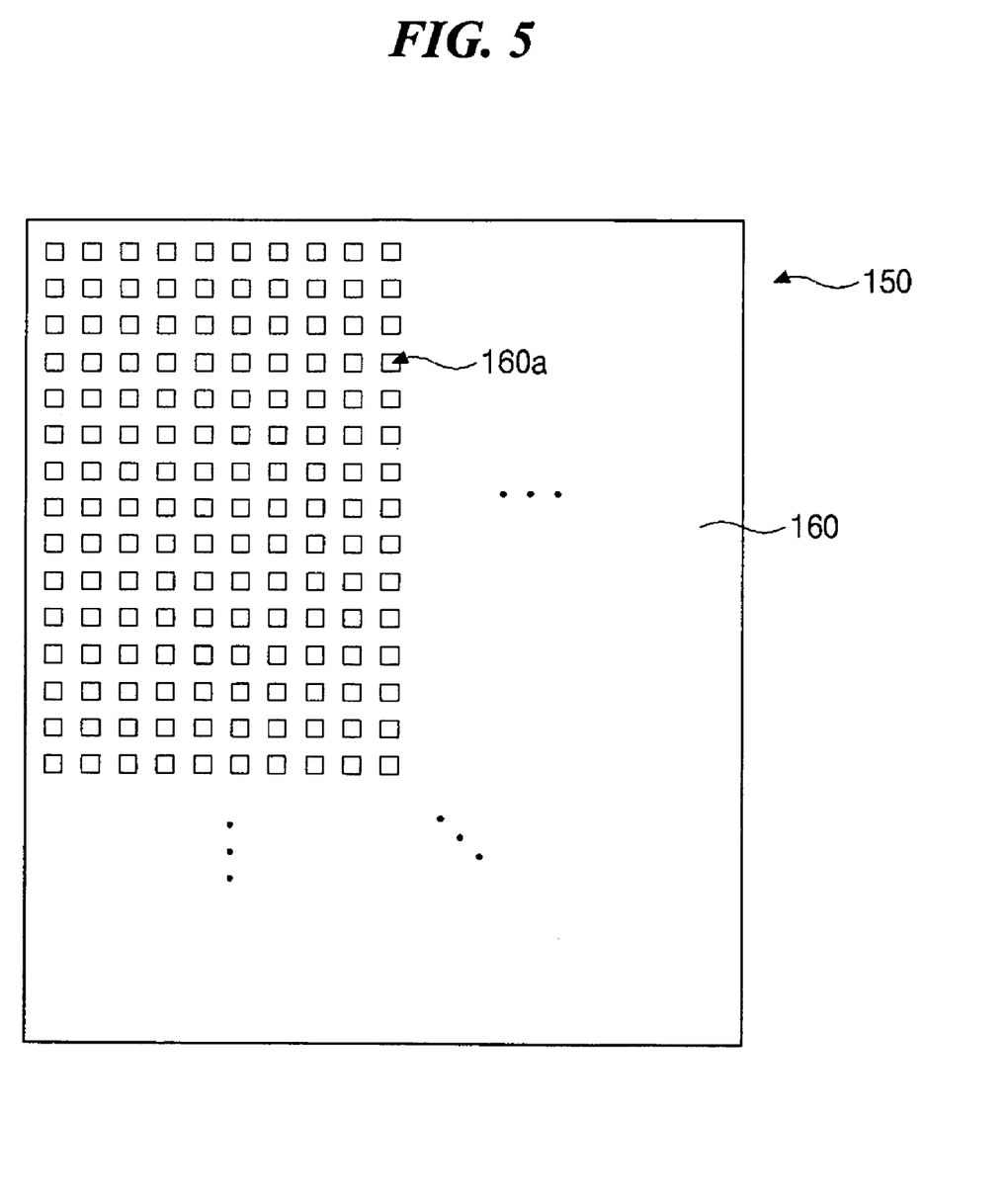
FIG. 5 is a schematic plan view of an exemplary semiconductor layer according to the present invention.

FIG. 5 is a schematic plan view of an exemplary semiconductor layer according to the present invention. In FIG. 5, a plurality of spot seeds 160a may be formed in a semiconductor layer 160 on a substrate 150. The plurality of spot seeds 160a may include polycrystalline silicon and a portion of the semiconductor layer 160 may include amorphous silicon. As a distance between adjacent spot seeds 160a increases (i.e., as a density of the plurality of spot seeds increases), grain size of a resultant polycrystalline silicon layer may increase. However, as the distance between the adjacent spot seeds 160a increases, an increase in the number of laser beam exposures may be required, thereby reducing production yield. Accordingly, the distance between the adjacent spot seeds 160a may be determined based upon a required grain size and production yield. For example, a distance between the adjacent spot seeds 160a may be within a range of about 0.5 μm to about 5 μm. After forming the plurality of spot seeds 160a, the semiconductor layer 160 may be entirely crystallized with a laser beam having an energy density corresponding to the NCM regime or CM regime.

Figure 6A:
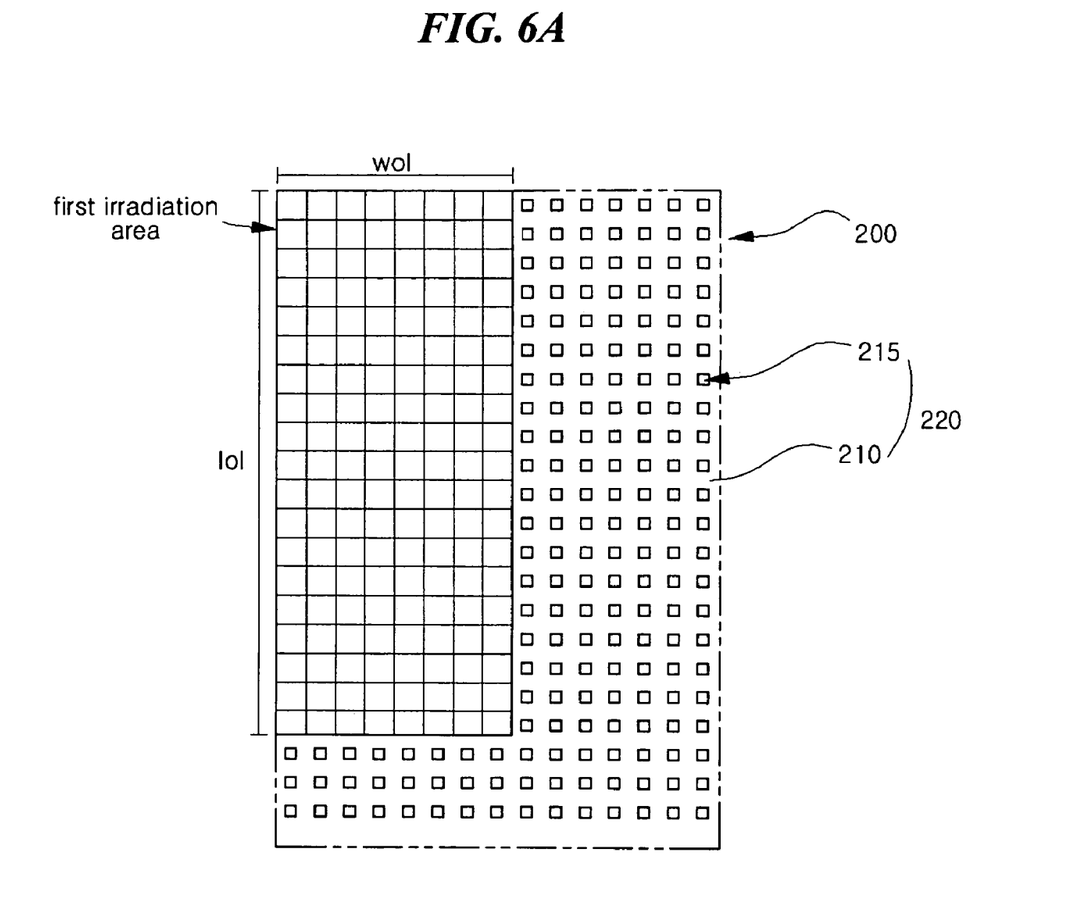
FIGS. 6A and 6B are schematic plan views of another exemplary method for forming a polycrystalline silicon layer according to the present invention.

FIGS. 6A and 6B are schematic plan views of another exemplary method for forming a polycrystalline silicon layer according to the present invention. In FIG. 6A, a laser beam may be irradiated onto a semiconductor layer 220 on a substrate 200 during a first irradiation step. The laser beam may have a rectangular shape by modifying a source beam of an excimer laser apparatus with an optical system. For example, the laser beam of a rectangular shape may have a width wol of about 0.1 mm to about 0.3 mm and a length lol of about several tens of millimeters to about several hundreds of millimeters. The semiconductor layer 220 may include a plurality of spot seeds 215 and a surrounding portion 210, wherein the plurality of spot seeds 215 may be formed of polycrystalline silicon and the surrounding portion may be formed of amorphous silicon.

The laser beam may have an energy density corresponding to one of a nearly complete melting (NCM) regime and a complete melting (CM) regime. For example, the energy density corresponding to one of an NCM regime and a CM regime may be within a range of about 240 mJ/cm² to about 300 mJ/cm² when the semiconductor layer 220 has a thickness of about 550 Å. A melting temperature for polycrystalline silicon is higher than a melting temperature of amorphous silicon. Since the plurality of spot seeds 215 may be formed of polycrystalline silicon, the plurality of spot seeds 215 may not completely melt even when a laser beam having an energy density corresponding to the CM regime is irradiated. Accordingly, the plurality of spot seeds 215 may be used as seeds for crystallization even when a laser beam having an energy density corresponding to the CM regime is irradiated.

Consequently, after the laser beam having an energy density corresponding to one of an NCM regime and a CM regime is irradiated during the first irradiation step, grains grow using the plurality of spot seeds 215 as seeds for crystallization and the semiconductor layer 220 is entirely crystallized within a first irradiation area. Since grains grow from each spot seed 215 and the plurality of spot seeds 215 may be equally spaced apart, each spot seed 215 may correspond to a central portion of each grain. In addition, since an energy density of the laser beam corresponds to one of an NCM regime and a CM regime, a process window for an energy density of a laser beam may be widened.

Figure 6B:
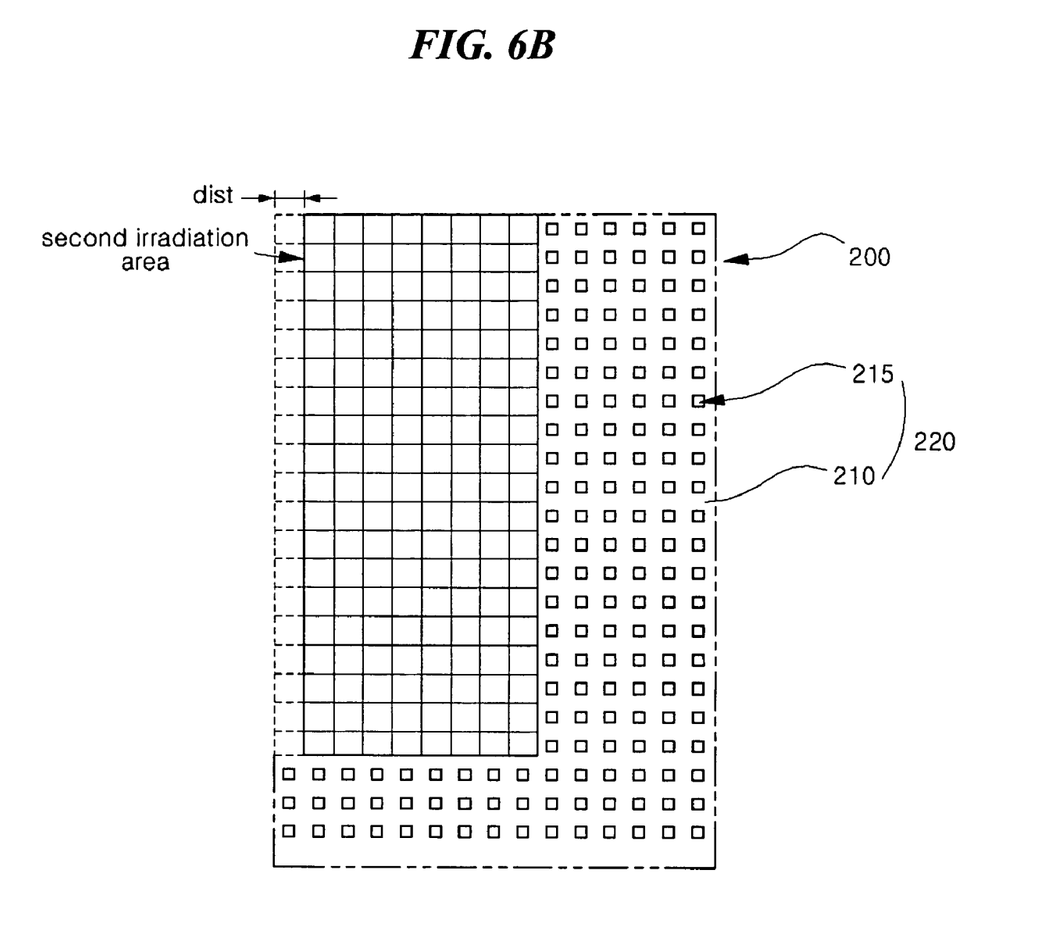

In FIG. 6B, after the laser beam moves by a step distance dist with respect to the substrate 200, a laser beam may be irradiated onto the semiconductor layer 220 during a second irradiation step. As the step distance dist increases, an overlap ratio of the laser beam may decrease and a shot density of the laser beam may decrease. The shot density may be defined as a number of laser irradiations per unit area of the semiconductor layer 200. For example, when the second irradiation area overlaps the first irradiation area by about 95%, the shot density may be about 20 shots/cm$^2$. By the second irradiation step, grains of the semiconductor layer 220 may further grow and defects within the grains may be cured. Since the grain growth may stop when adjacent grains meet each other, the grain size may correspond to a distance between adjacent spot seeds.

According to the present invention, after a plurality of spot seeds 215 are uniformly formed in a semiconductor layer 220 using a crystallization mask, the semiconductor layer 220 may be entirely crystallized by a laser beam having an energy density corresponding to an NCM regime or a CM regime having a wide process window. Accordingly, grains of the polycrystalline silicon layer may have uniform sizes and uniform positions. For example, the grains of the polycrystalline silicon layer may have a substantially equal sizes and may be disposed at predetermined positions.

According to the present invention, the polycrystalline silicon layer may be used as an active layer of a TFT (poly-TFT), and the poly-TFT may be used as a switching element for display devices, such as an LCD devices and an ELD devices. In addition, the poly-TFT may include a gate insulating layer on the active layer, a gate electrode on the gate insulating layer, an interlayer insulating layer on the gate electrode, and source and drain electrodes on the interlayer insulating layer. Accordingly, the active layer may have a plurality of grains with each of the grains being equal to one another in size due to use of a plurality of spot seeds. Since the polycrystalline silicon layer has uniform grain sizes and uniform positions, operational characteristics of the TFT and display quality of the display device may be improved.

It will be apparent to those skilled in the art that various modifications and variations can be made in the method of forming polycrystalline semiconductor layer and thin film transistor using a polycrystalline semiconductor layer of the present invention without departing from the spirit or scope of the invention. Thus, it is intended that the present invention cover the modifications and variations of this invention provided they come within the scope of the appended claims and their equivalents.

What is claimed is:

1. A method of forming a polycrystalline semiconductor layer, comprising:
   forming a semiconductor layer of amorphous silicon on a substrate;
   forming a plurality of spot seeds in the semiconductor layer by irradiating a first laser beam through a crystallization mask, each of the plurality of spot seeds being equally spaced from one another and each having equal area, wherein each of the plurality of spot seeds includes polycrystalline silicon; and
   forming a polycrystalline silicon layer along an entire surface of the substrate by irradiating a second laser beam onto the semiconductor layer, wherein an area between adjacent spot seeds is entirely exposed to the second laser beam,
   wherein the first laser beam has an energy density to completely melt the entire semiconductor layer and the second laser beam has an energy density to melt most of the semiconductor layer, wherein the energy density of the first laser beam is larger than the energy density of the second laser beam.

2. The method according to claim 1, further comprising forming a buffer layer between the substrate and the semiconductor layer.

3. The method according to claim 1, wherein irradiating the second laser beam is repeated more than twice.

4. The method according to claim 1, wherein the crystallization mask includes a plurality of transmissive areas and a blocking area surrounding the plurality of transmissive areas.

5. The method according to claim 4, wherein the plurality of transmissive areas correspond to the plurality of spot seeds.

6. The method according to claim 1, wherein a distance between adjacent spot seeds is within a range of about 0.5 μm to about 0.5 μm.

7. The method according to claim 1, wherein each of the spot seeds has a rectangular shape, and one side of the rectangular shape is within a range of about 0.5 μm to about 2 μm.

* * * * *